United States Patent
Chang

(10) Patent No.: US 7,216,324 B2
(45) Date of Patent: May 8, 2007

(54) METHOD FOR DESIGNING CHIP PACKAGE BY RE-USING EXISTING MASK DESIGNS

(75) Inventor: Shih-Cheng Chang, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 162 days.

(21) Appl. No.: 11/078,781

(22) Filed: Mar. 11, 2005

(65) Prior Publication Data

US 2006/0214307 A1  Sep. 28, 2006

(51) Int. Cl.
*G06F 17/50* (2006.01)
*G06F 9/45* (2006.01)

(52) U.S. Cl. ............... 716/10; 716/13; 716/8
(58) Field of Classification Search ............ 716/9, 716/10, 13, 8
See application file for complete search history.

(56) References Cited

U.S. PATENT DOCUMENTS

| | | | |
|---|---|---|---|
| 5,759,910 A * | 6/1998 | Mangold et al. ............ 438/613 |
| 6,229,219 B1 * | 5/2001 | Bhagath et al. ............ 257/778 |
| 6,532,581 B1 * | 3/2003 | Toyonaga et al. ............ 716/11 |
| 6,933,611 B2 * | 8/2005 | Kever ........................ 257/778 |
| 7,117,467 B2 * | 10/2006 | Ali et al. .................... 716/10 |
| 2004/0195703 A1 * | 10/2004 | Lane et al. ................. 257/784 |
| 2006/0125110 A1 * | 6/2006 | Do et al. .................... 257/778 |

* cited by examiner

*Primary Examiner*—Jack Chiang
*Assistant Examiner*—Magid Y. Dimyan
(74) *Attorney, Agent, or Firm*—K & L Gates LLP

(57) ABSTRACT

A method is disclosed for completing a flip chip package design by re-using mask designs in a tool library. The method comprises analyzing one or more input/out bump locations of a chip, analyzing one or more solder ball locations of a package hosting the chip with regard to a predetermined printed circuit board, and designing the package hosting the chip by using a tool library containing one or more existing mask designs for re-use, wherein when one or more existing mask designs are used for the package, at least one custom connection layer of the package is redesigned when needed for connecting the chip to the printed circuit board without producing a full set of new masks for the package.

13 Claims, 4 Drawing Sheets

METHOD FOR DESIGNING CHIP PACKAGE BY RE-USING EXISTING MASK DESIGNS

BACKGROUND

The present invention relates generally to semiconductor chip design, and more particularly to a method for re-using flip chip package design by a channel-driven flow.

Driven by growing demand for smaller, faster and cheaper electronic devices, the semiconductor industry continues to push the development of newer technologies in chip design. For example, and as is known by those skilled in the art, the industry has gone through various generations of wire bonding and flip chip technologies. Because flip chip technologies can achieve high input/output (I/O) performance and clock speed, it is increasingly used as the technology of choice in most speed-critical designs. Currently, a vast majority of microprocessors and high-end digital signal processors are being assembled today using flip chip technology.

Prior to 90-nm technology, flip chip packaging was a relatively inexpensive option for a select set of devices requiring high density I/O (>800) or high power (>5 W), because those devices require a design with minimal number of routing layers and integrated solutions. However, the multiple routing layers and integrated thermal solutions required to handle today's designs have put packaging cost on par with, if not greater than, the silicon itself. If not designed properly, the integrated circuit (IC) can dictate an even more expensive packaging solution, such as additional routing layers or finer design rules. Therefore, package design cannot be done as an afterthought to the chip design process. This subtle change in the relationship between silicon and packaging costs has key ramifications.

Additionally, the cost of making a mistake in silicon design or the substrate design has grown as mask costs and tooling charges have increased dramatically in the move to smaller mask sets and flip chip substrates. The interrelationship between silicon and packaging must therefore be addressed as early as is applicable.

In view of the above, desirable in the art of flip chip technologies are additional methods for reducing the integration cost between silicon design and package layout design restrictions.

SUMMARY

In view of the foregoing, the following provides a method for reducing the integration cost between silicon design and package layout design restrictions. The standardization of layers in a package substrate allows a single package to be used for multiple chip design layout after little design modification.

In one embodiment, a method comprises analyzing one or more input/out bump locations of a chip, analyzing one or more solder ball locations of a package hosting the chip with regard to a predetermined printed circuit board, and designing the package hosting the chip by using a tool library containing one or more existing mask designs for re-use, wherein when one or more existing mask designs are used for the package, at least one custom connection layer of the package is redesigned when needed for connecting the chip to the printed circuit board without producing a full set of new masks for the package.

The construction and method of operation of the invention, however, together with additional objects and advantages thereof will be best understood from the following description of specific embodiments when read in connection with the accompanying drawings.

DESCRIPTION

The following disclosure provides a method for incorporating a channel-driven feature in a process for package design.

Figure 1:
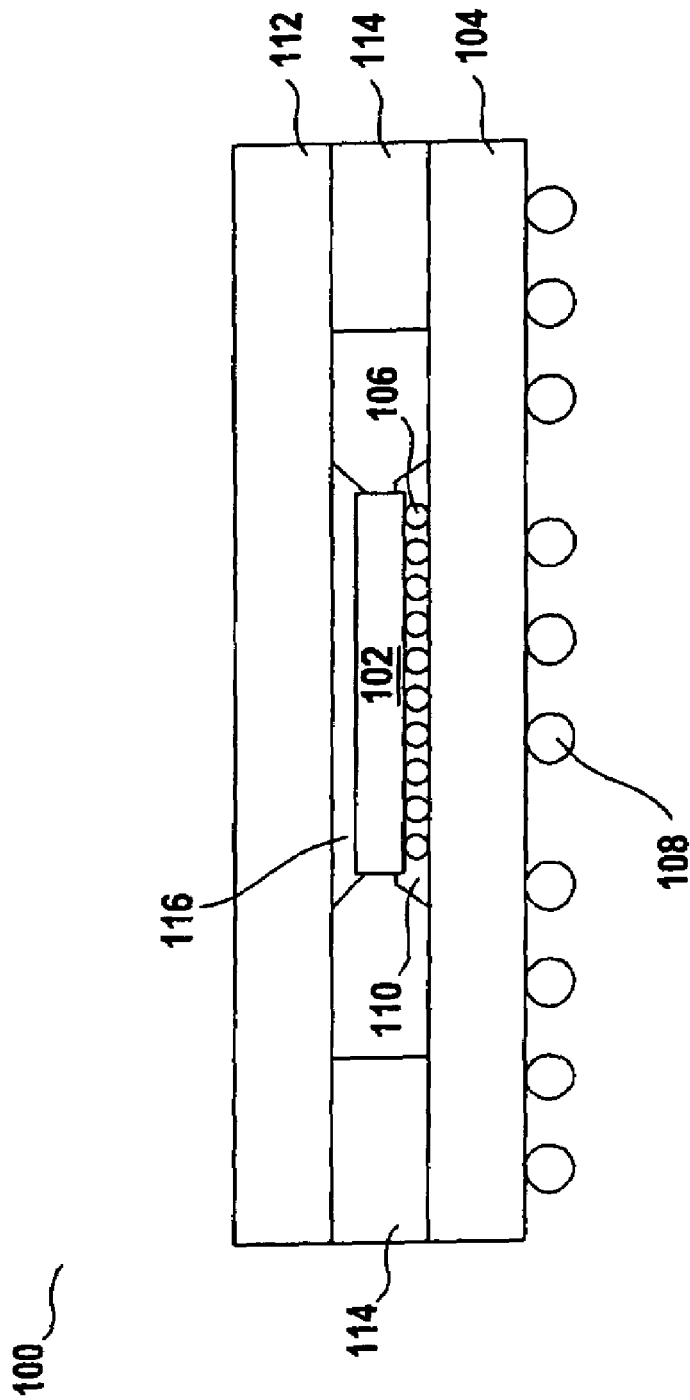
FIG. 1 presents a cross section of a conventional flip chip package.

FIG. 1 presents a cross section of a conventional flip chip package 100. In a conventional design, there are typically two main components: a die 102 and a package 104. The die 102 includes the electronics and devices required for the processing of data and/or signals. The package 104 provides a support for the die 102. I/O ports located at the bottom of the die 102 connect to the package 104 through a plurality of solder bumps 106 located at the top of the package 104. These bumps are guided to the package through a series of thin conductor and via layers. The I/O ports are accessible at the exterior of the package 104 through a plurality of solder balls 108, located outside of the package 104. To ensure a good connection from the solder bumps 106 of the die 102 to the package 104, an underfill 110 is used. The underfill 110 acts as an epoxy to glue the solder bumps 106 to the package 104. In addition, the underfill 110 is a volume filler and prevents air bubbles from forming between the solder bumps 106 and the package 104. Additional components are added to the package 104 to protect the die 102 from damage. Such components include a heat spreader 112 and a plurality of stiffeners 114.

To prevent the die 102 from overheating, the top surface is packed with a non-conductive thermal grease 116. The thermal grease 116 also connects to the heat spreader 112, thereby dissipating heat to the air through convection. The plurality of stiffeners 114 surrounds the die 102 like a ring and prevents the die 102 from being crushed. All the above components provide the basis for a flip chip package.

Figure 2:
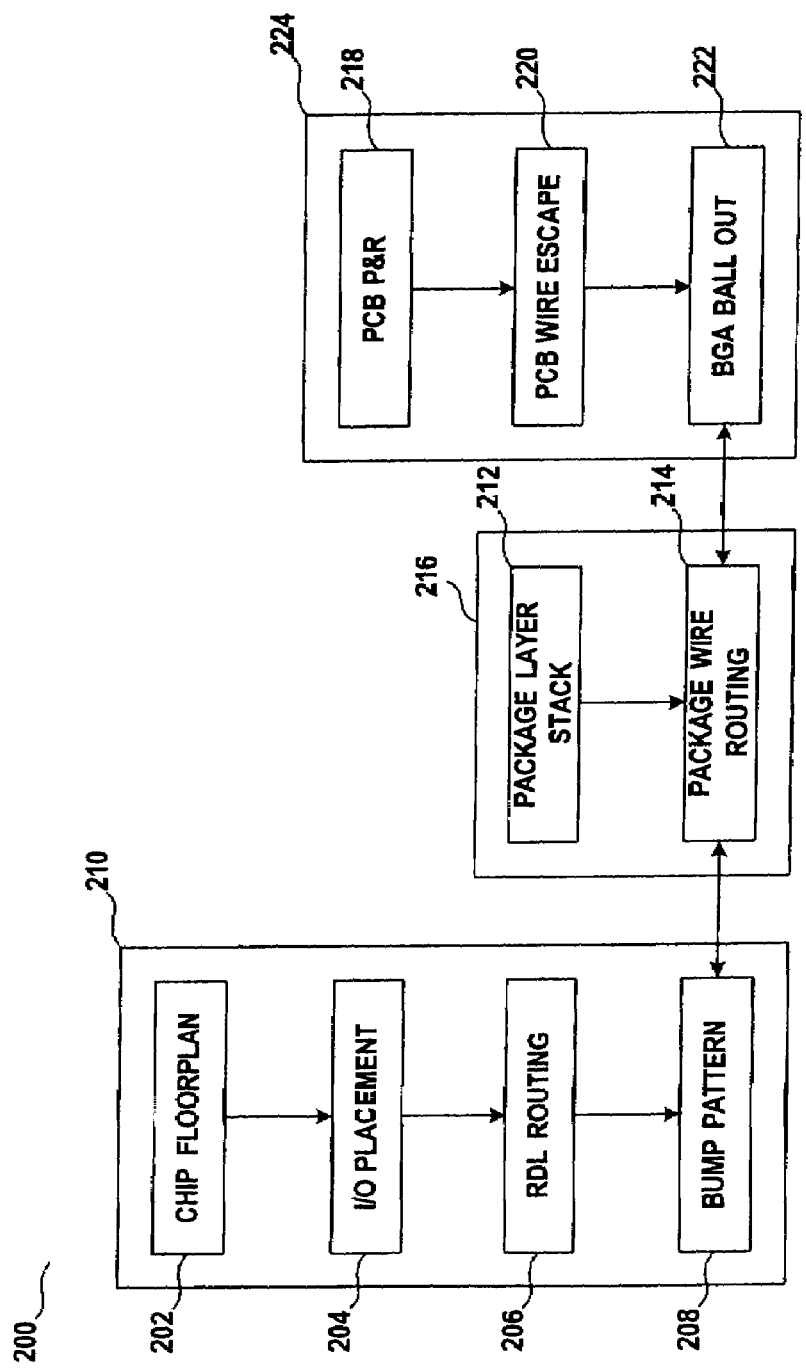
FIG. 2 presents a flow for a conventional process for IC, package, and PCB designs.

FIG. 2 presents a flow 200 for a process for completely designing chip, package, and PCB layouts. In step 202, the chip floorplan is designed. In this step, a chip planning software provides information such as functional blocks, quantity of I/O blocks, chip size and aspect ratio, voltage budgets, clock skew budgets, noise budget and access timing requirements. Basically, the chip floorplan provides the critical basis, while other non-critical requirements are provided at a later stage. In step 204, the chip's I/O solder pads are assigned based on one or more package considerations, including I/O pad cell placements, cell rows, spacing, power grids, clock distribution etc. This information is then passed to step 206, where a redistribution layer (RDL) is designed. The RDL connects major components together through a dedicated layer. This layer is required since the die's I/Os are not placed in the same fashion as the package bumps. More specific to this layer is the reroute design of signal path from components to components and connections between components and the I/O buffer pads to die bump locations. In step 208, the chip's bump pattern is designed. Normally the chip's bumps match the chip's I/O placements from step 204, but additional wires for power and ground must also be accessible to the package through the bumps. A typical pattern for a chip's I/O includes a square grid that could contain thousands of pins. The combination of the steps 202 to 208 constitutes a chip layout design flow 210.

A package design flow 216 provides steps 212 and 214 for packaging. In step 212, the package layer stack is designed. This layer stack includes bump location on package, flip chip escape routing, package RDL, package routing layer and finally the ball assignment on the package. For example, a sample package size is 37.5 mm×37.5 mm with 1292 balls, and layer stack is 3+4+3 build up organic substrate. In step 214, the package wire routing is designed. More specifically, the conductor-via layers are designed. These layers connect up to thousands of the chip's I/O to the package's solder bumps. It is this step that creates incompatibilities between different chips. The complexity of this layer prolongs the package completion and increases the cost.

A PC board (PCB) design flow 224 provides steps 218 to 222 for PCB. This flow 224 commits to the integration of electronic elements including multiple chip packages and discrete electrical components. In step 218, the PCB place and route (P&R) is designed. P&R provides component placement in accordance with design requirements for maximum performance. In step 220, the PCB is laid with wire escapes. This wire escape includes the connections between components in the PCB and any current or voltage requirement for functionality. In step 222 the ball grid array (BGA) ball out is designed. This step involves the location of soldering spots required for the population of the PCB, but more importantly for the placement of the chip package. The flows 210, 216 and 224 necessarily pass information from one to the other to ensure that the integrated circuit, the packaging and the PCB connections are properly designed and planned for. However, one disadvantage with respect to this conventional flow 200 is that the packaging is typically designed specifically for a chip layout and a PCB layout. While such custom packaging is functional, the design cost thereof is huge.

Figure 3:
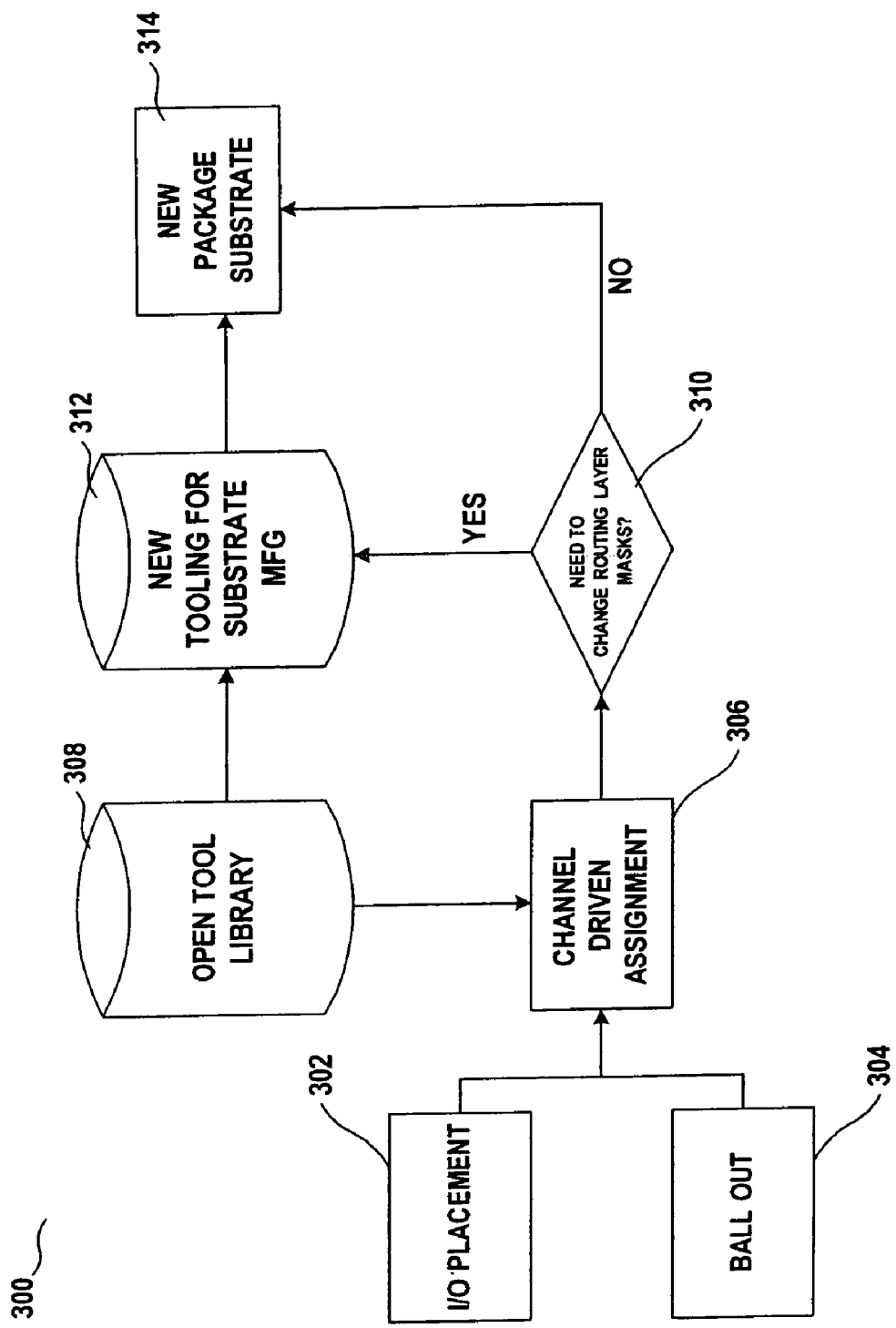
FIG. 3 presents a flow with a channel-driven feature in accordance with one embodiment of the present invention.
Figure 4:
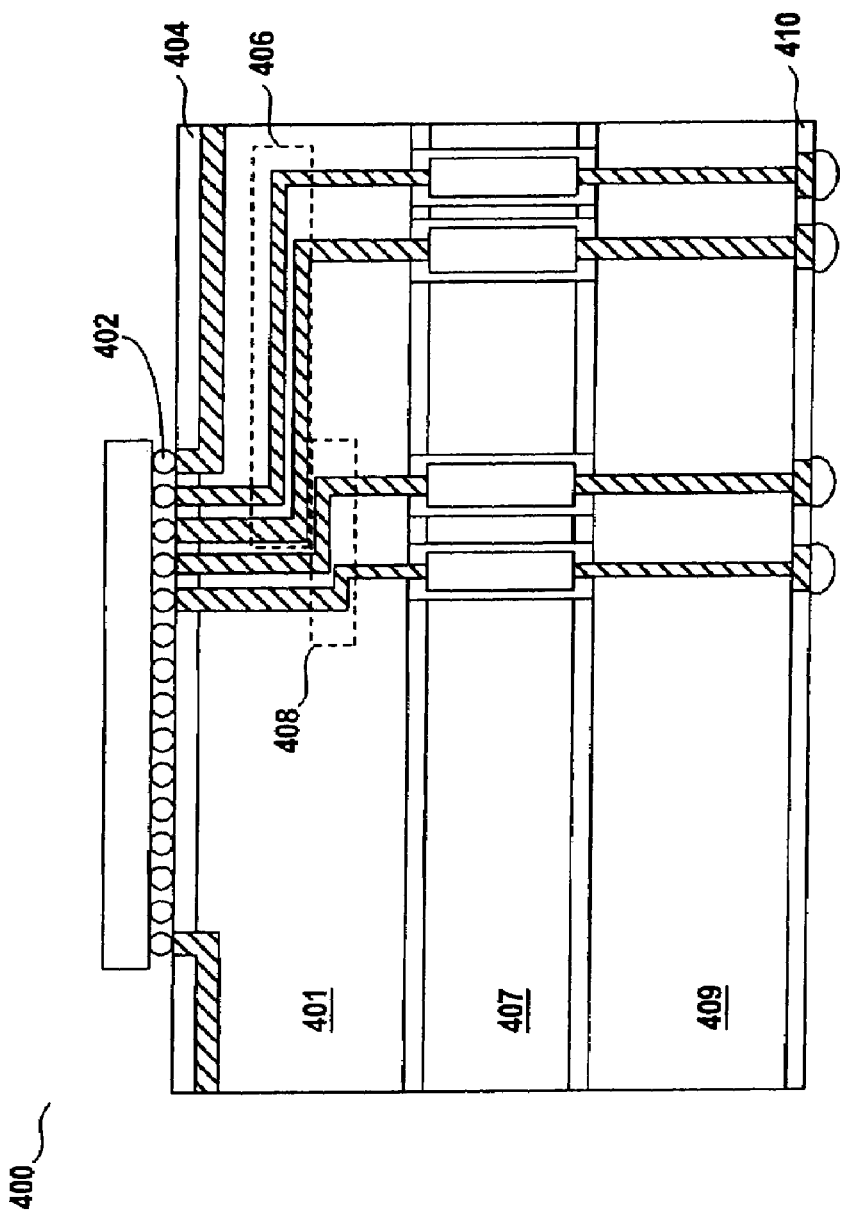
FIG. 4 presents a cross section of a smooth fan-out on package implementation in accordance with one embodiment of the present invention.

FIG. 3 presents a flow 300 with a channel-driven feature in accordance with one embodiment of the present invention. FIG. 4 presents a cross section 400 of a smooth fan-out on package implementation in accordance with one embodiment of the present invention. It is understood that existing tooling masks of package substrates can be collected to form a tool database/library, which may include masks of power/ground planes, various ball patterns, various bump patterns, solder mask layers, etc., can be further classified by design variables such as package/substrate size, chip size, bump pitch, ball pitch, maximum number of the I/Os, number of power/ground plans, total solder ball numbers, total bump numbers, etc. With this database and when a new design is needed, the database can be searched to form an outline of a new package. An optimized placement and assignment planning for I/O pins, bumps, and all the way to the solder balls through one or more signal routing layers (i.e., the channel driven flow) can be made using design tools.

In step 302, the I/O placement on a chip's P&R is analyzed. More specifically, the locations of the chip's solder bumps connecting to the upper most layer of the routing layer are analyzed. In a preferred embodiment, this analysis is performed by first creating at least a netlist of components and their respective connections. This analysis is helpful for pin placement and assignment, as well as minimizing the size that is needed for placing such a chip in a package.

In step 304, the locations of the package solder balls are analyzed to fit in the PCB board design. Since the solder balls are the connections between the package (and the chip in it) and the board, compatibility issues may need to be examined including the number of pins, the pattern of pin grid, the distance between pins, and power and ground alignment. With the steps 302 and 304, a optimized connection relation between the chip input/output bump locations and the solder ball locations is identified. The EDA tools are useful for identifying or modifying this relation.

In step 306, a netlist created from steps 302 and 304 is used by an electronic design automation (EDA) tool that can automatically generate channel-driven assignments from the ball to the bump, or from the bump to the ball, through connection package layers. When design such a channel driven connection assignment, the tool database/library is searched in step 308 based on design parameters, wherein some existing substrate tooling masks are selected for use. This open tool library includes details about the chip manufacturing specifications or design parameters such as substrate size, chip size, bump pitch, ball pitch and layer mapping as stated above. If the existing masks can be used, the package design is checked for custom connection layer masks compatibility in step 310 to determine whether some custom routings have to be done. Obviously, if too many discrepancies are found between existing mask designs in the tool library and the new chip design, wherein the die, package, and PCB layout are found to be too incompatible, other solutions may be used to design the chip package.

If one or more new masks need to be generated in step 312, it may also take advantage of having the open tool library so that the designs of these new masks do not need to be initiated from scratch. Since only a few new signal routing layers are involved for custom connection layer routing, the tooling cost is reduced. Modifications such as minor wire routing may need to be done to satisfy the compatibility requirement. These are largely done in the wire routing custom connection layer. When the package connection layers meet the requirement of the new chip layout, the package substrate design is finalized in step 314 and it is used for chip integration and manufacturing.

As further illustrated in FIG. 4, one or more connection layers are in the package for hosting the die and bringing the signals provided by the die bumps out to the solder balls. Typically, in these connection layers, there is at least one custom connection layer (e.g., connection layer 401) which may contain one or more signal layers 406 and 408 and in which signal routing can be accomplished to place an electrical connection from a particular bump to a particular location to be further connected to connection channels of lower connection layers.

To reduce the time necessary for adjusting the connection layers of a package, the lower connection layers of the package are usually of a standard design such as the standard connection layers 407 and 409. In these standard connection layers, the connection channels (e.g., via, metal contact, or any horizontal or vertical wire connection mechanisms) are of a standard pattern. In order to make connections between the die bumps and the package solder balls and to avoid unnecessary wire crossings on the package substrate, the die bumps are routed through the custom connection layer 401 to be aligned with and put in contact with standard connection points on the standard connection layer 407, which is further connected to the solder balls through the standard connection layer 409. A correlation sequence between the balls and bumps are assigned once the routing in the custom and standard connection layers are completed. For the package, components eligible for standardization are not limited to the standard connection layers, and they may include a plurality of chip's bump contacts 402, common via and routing layers, a ground plane 404 and a plurality of package balls 410. As it can be seen, the layers 406 and 408 are not standardized and need to be provided by one or more masks newly generated. But other masks can be re-used from the previous design.

In general, the present disclosure allows a design engineer to determine what changes need to be made to the package layers, and more specifically, what layers need to be changed. By providing enough re-usable packaging layouts, cost may be dramatically reduced as a full set of new masks are not necessarily to be made due the re-use of existing masks. At the same time, a mechanism for determining incompatibility is also contemplated to further save process cost.

This invention provides a novel method for reducing the integration cost between chip and package layout design restrictions. By standardizing mask layers of a package substrate, a single package design can inherently be used for multiple chip design layouts. The standardization of package masks leads to a reduction of layer adjustment design, thereby contributing to lower cost and faster package substrate design.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for completing a flip chip package design, the method comprising:
    analyzing one or more input/out bump locations of a chip;
    analyzing one or more solder ball locations of a package hosting the chip with regard to a predetermined printed circuit board;
    assigning an optimized connection relation between the input/output bump locations to the solder ball locations; and
    designing the package hosting the chip by using a tool library containing one or more existing mask designs for re-use, wherein the tool library is searchable by design parameters including chip size, package size, and bump pitch, and
    wherein when one or more existing mask designs are used for the package, at least one custom connection layer of the package is redesigned when needed for connecting the chip to the printed circuit board without producing a full set of new masks for the package.

2. The method of claim 1 wherein the assigning further includes using one or more electronic design automation tools.

3. The method of claim 1 wherein the designing further includes searching the tool library for a suitable package design using one or more design parameters to find one or more mask designs.

4. The method of claim 3 wherein the design parameters further includes a total number of bumps, solder ball pitch, a total number of balls, a number of the input/output pin numbers of the chip, and a number of power and ground planes and their types.

5. The method of claim 1 wherein to package further includes one or more standard connection layers with standardized connection patterns for routing signals from the custom connection layer to the solder ball locations.

6. The method of claim 5 wherein the custom connection layer further includes one or more signal routing layers for making connections between to bump locations and the standard connection layers.

7. A method for completing a flip chip package design, the method comprising:
    analyzing one or more input/out bump locations of a chip;
    analyzing one or more solder ball locations of a package hosting the chip with regard to a predetermined printed circuit board;
    assigning an optimized relation between the input/output bump locations to the solder ball locations using one or more electronic design automation tools; and
    designing the package hosting the chip based on the optimized relation by using a tool library containing one or more existing mask designs for re-use,
    wherein, the tool library is searchable by design parameters including chip size, package size, bump pitch, a total number of bumps, solder ball pitch, a total number of balls, a number of the input/output pin numbers of the chip, and a number of power and ground planes and their types, and
    wherein when one or more existing mask designs are used for the package, at least one custom connection layer of the package is redesigned when needed for connecting the chip to the printed circuit board without producing a full set of new masks for the package.

8. The method of claim 7 wherein the designing further includes searching the tool library for a suitable package design using one or more design parameters to find one or more mask designs.

9. The method of claim 7 wherein the package further includes one or more standard connection layers with standardized connection patterns for routing signals from the custom connection layer to the solder ball locations.

10. The method of claim 9 wherein the custom connection layer further includes one or more signal routing layers for making connections between the bump locations and the standard connection layers.

11. A method for completing a flip chip package design, the method comprising:
    analyzing one or more input/out bump locations of a chip;
    analyzing one or more solder ball locations of a package hosting the chip with regard to a predetermined printed circuit board;
    assigning an optimized relation between the input/output bump locations to the solder ball locations using one or more electronic design automation tools; and
    designing the package hosting the chip based on the optimized relation by using a tool library containing one or more existing mask designs for re-use,
    wherein the tool library is searchable by design parameters including chip size, package size, bump pitch, a total number of bumps, solder ball pitch, a total number of balls, a number of the input/output pin numbers of the chip, and a number of power and ground planes and their types, wherein the package further includes at least one custom connection layer and one or more standard connection layers with standardized connection patterns for routing signals from the custom connection layer to the solder ball locations, and wherein when one or more existing mask designs are used for the package, at least one custom connection layer of the package is redesigned when needed for connecting the chip to the printed circuit board without producing a full set of new masks for the package.

12. The method of claim 11 wherein the designing further includes searching the tool library for a suitable package design using one or more design parameters to find one or more mask designs.

13. The method of claim 11 wherein the custom connection layer further includes one or more signal routing layers for making connections between the bump locations and the standard connection layers.

* * * * *